US007466831B2

(12) United States Patent
Magrath

(10) Patent No.: US 7,466,831 B2
(45) Date of Patent: Dec. 16, 2008

(54) AUDIO PROCESSING

(75) Inventor: Anthony J. Magrath, Edinburgh (GB)

(73) Assignee: Wolfson Microelectronics plc, Edinburgh (GB)

(*) Notice: Subject to any disclaimer, the term of this patent is extended or adjusted under 35 U.S.C. 154(b) by 973 days.

(21) Appl. No.: 11/002,207

(22) Filed: Dec. 3, 2004

(65) Prior Publication Data

US 2006/0083381 A1 Apr. 20, 2006

(30) Foreign Application Priority Data

Oct. 18, 2004 (GB) ................................ 0423097.5

(51) Int. Cl.
*H03G 5/00* (2006.01)

(52) U.S. Cl. ......................... 381/103; 381/107; 381/17; 381/1

(58) Field of Classification Search ................... 381/17, 381/18, 19, 102, 103, 104, 107, 108, 109, 381/1
See application file for complete search history.

(56) References Cited

U.S. PATENT DOCUMENTS 4,121,059 A 10/1978 Nakabayashi
4,329,544 A 5/1982 Yamada
4,812,921 A 3/1989 Mitsuhashi et al.
5,661,808 A 8/1997 Klayman
5,970,153 A 10/1999 Petroff
6,424,719 B1 * 7/2002 Elko et al. ..................... 381/1
6,504,933 B1 1/2003 Chung
6,540,933 B1 4/2003 Sievert et al.
6,587,565 B1 7/2003 Choi
6,690,799 B1 2/2004 Iwase et al.
6,700,980 B1 * 3/2004 Hamalainen et al. .......... 381/17
6,956,954 B1 * 10/2005 Takemura et al. ........... 381/307
7,076,071 B2 * 7/2006 Katz .......................... 381/307
2002/0118839 A1 8/2002 Schott

FOREIGN PATENT DOCUMENTS

| | | |
|---|---|---|
| DE | 3414554 | 10/1985 |
| EP | 0 373 760 | 6/1990 |
| JP | 2000-50399 | 2/2000 |
| WO | WO 00/70913 | 11/2000 |

* cited by examiner

*Primary Examiner*—Vivian Chin
*Assistant Examiner*—Con P Tran
(74) *Attorney, Agent, or Firm*—Dickstein Shapiro LLP

(57) ABSTRACT

The present invention relates to audio signal processing such as equalisation and spatial enhancement functions. The present invention provides an audio signal processing circuit arrangement for two audio channels, and which combines spatial enhancement or acoustic mixing (crosstalk) cancelling with graphic equalisation functions. This is achieved with a circuit structure having a reduced filter count compared with known cascaded circuits dedicated to each function. The circuit structure processes the sum and difference signals through separate filters and then recombines them to recover the separate channels (adding and subtracting respectively).

15 Claims, 4 Drawing Sheets

AUDIO PROCESSING

FIELD OF THE INVENTION

The present invention relates to audio signal processing such as equalisation and spatial enhancement functions, and is particularly but not exclusively concerned with digital signal processing of digital audio signals.

BACKGROUND OF THE INVENTION

Two common effects for improving the perceived quality of stereo audio are stereo enhancement and frequency-response equalisation.

Spatial or stereo enhancement effects work by cancelling crosstalk components that occur due to acoustic mixing of left and right signals between the loudspeaker and the ear. The result is to give an impression of increased stereo separation between channels. FIG. 1 shows how the listener's left ear (Le) receives signals intended for the right ear via path B, i.e. Le=A.Lo+B.Ro where Lo and Ro are the output signals from the left and right speakers and A and B are the acoustic transfer functions for paths A and B, and similarly, the right ear receives signals intended for the left ear.

Two circuits are commonly used for cancelling these crosstalk components. FIG. 2*a* shows the classical crosstalk canceller. This comprises two stereo enhancement filters C for filtering the left and right channels, and two adders $A_L$ and $A_R$. Li and Ri are audio signals received from left and right signal sources. Adder $A_L$ subtracts the right channel input Ri, after filtering, from the left channel input Li to give a left channel output Lo. Adder $A_R$ provides a corresponding function to provide the right channel output Ro. It can be shown that if the filter C has the transfer function B/A, the crosstalk components cancel perfectly.

$$Lo = Li - C \cdot Ri, \text{ and } Ro = Ri - C \cdot Li$$

$$\begin{aligned} Le &= A \cdot (Li - C \cdot Ri) + B \cdot (Ri - C \cdot Li) \\ &= A \cdot Li - B \cdot Ri + B \cdot Ri - Li \cdot B^2 / A \\ &= A \cdot Li \cdot (1 - B^2 / A^2) \end{aligned}$$

In general, filter C is designed with a simple low-pass function to mimic the diffraction effect of the listener's head in path B, based on the assumption that path A has little filtering effect. Filter C may also be designed as a bandpass function to prevent cancellation of bass signals which are recorded equally in left and right channels.

A second known circuit is shown in FIG. 2*b*. Here the difference between the left input Li and right input Ri channels is filtered (C') and scaled (K). This processed signal is then added ($A_L$) to the left input signal Li to produce the left output signal Lo, and is subtracted ($A_R$) from the right input signal Ri to produce the right output signal Ro. This modification results in similar crosstalk cancellation properties, with complete cancellation when C'=B/(A−B), giving Le=A.Li.(1+(B/A)). However it only requires a single filter, thus making implementation simpler and cheaper. The circuit also has a "3D-gain" controller which is implemented by a scaling unit having variable gain K, which allows the extent of the stereo enhancement or acoustic crosstalk cancellation effect to be adjusted.

Although stereo enhancement filters (C or C') are usually designed with a bandpass or lowpass function, the effect can be crude and produces an unnatural sounding stereo image. This is due to the gross approximation that the transfer function B/A is lowpass. More interesting or subtle effects can be produced by using a more flexible filter function. For example, it is useful to be able to modify these filters to compensate for differences in loudspeaker placement and the shape of the listener's head, so as to more closely match the response of function B/A. In practice this will be enabled by user controlled inputs to control the filter characteristics and/or the extent of the stereo enhancement effect (K).

Another common effect is Frequency Response Equalisation, which is used to modify the frequency characteristics of an audio signal to either compensate for the frequency response of the listening environment, or to adjust the sound to suit the listener's preference. Typically a graphic equaliser function is used provide boost or cut over a number of different audio frequency bands.

When implementing both a spatial enhancement effect and equalisation effects, three filters are required, one ($C_{LR}$ and $C_{ER}$) for each channel in the equaliser, and one in the spatial enhancer (C'). Typically these functional blocks are simply cascaded together, as illustrated by the additional filters $C_{EL}$ and $C_{ER}$ shown in dashed outline in FIG. 3. Normally $C_{EL}$ and $C_{ER}$ will be the same transfer function $C_E$, say.

In applications where implementation cost needs to be kept to an absolute minimum, the hardware cost of implementing these filters can be prohibitive. For portable battery-powered equipment (generally driving headphones, but similar features are still desirable), power consumption is also an important consideration. If the filters are implemented on an ALU (Arithmetic Logic Unit) core, the number of multiply cycles are at a premium, and so it is advantageous to minimise the number (or complexity) of the filters in order to avoid increasing the clock frequency of the ALU. Higher clock frequencies demand higher power consumption, and possibly a larger chip area, or at worst having to add an extra ALU to the system.

It is thus desirable to be able to provide both spatial enhancement and frequency response equalisation, but with reduced hardware cost and power consumption.

SUMMARY OF THE INVENTION

In general terms in one aspect the present invention provides an audio signal processing circuit arrangement for two audio channels, and which combines spatial enhancement or acoustic mixing (crosstalk) cancelling with equalisation functions. The circuit structure processes the sum and difference signals through separate filters and then recombines them to recover the separate channels (adding and subtracting respectively).

Such an arrangement provides a number of advantages including reduced hardware cost and complexity, which is especially important in low cost consumer electronics. This is achieved in an embodiment with a circuit structure having a reduced filter count compared with known cascaded circuits dedicated to each function. An additional advantage is the reduced power consumption of the arrangement due to the reduction of filter functions which are implemented as multiply and add operations on an arithmetic logic unit (ALU). Minimising the number of computations required in this way allows the clock frequency to be reduced and hence power consumption reduced. This is particularly important in portable devices such as personal MP3 players.

A further or alternative advantage is that the filter headroom requirements are reduced. This compares with simply cascading the spatial enhancement effect and equaliser. If a large L−R difference signal occurs, it becomes difficult to manage filter headroom requirements. This is because it is possible that the user will select a high gain for both blocks, causing premature signal overload at large transient overshoots or at frequencies where both filters have high gain, or even where the response of the first block shows peaks and the second is adjusted to give corresponding attenuation to avoid overload at the system output, still giving signal overload at the intermediate node. Such an overload can only be avoided by increasing the width of the digital word, again with penalties in hardware cost and power consumption. Conversely, the first filter may have a large dip in its response, which is then compensated for by a peaking in the second filter response, resulting in an amplification of the quantisation noise or numerical rounding errors from the first filter, which would require more bits at the LSB end of the digital word, to maintain a desired signal-to-noise ratio. This potential headroom problem is not an issue in the embodiments because there is no cascading of filters and so no need for the "last" filter(s) to be capable of handling an otherwise large input dynamic range.

In an embodiment the filtered sum and difference signals are added to the separate input signals in order to provide stereo enhancement and/or equalisation functions. With appropriate scaling of the filtered difference and sum signals and of the input signals, the mix of these two effects can be controlled by a user.

In particular in one aspect there is provided a signal processing circuit for audio signals according to claim 1.

There is also provided a method of processing audio signals according to claim 12.

Whilst the circuit and method are well suited to digital signal processing such as implementing cross-talk cancellation and equalisation functions in digital audio signals, they are also applicable to analogue implementation and analogue signal processing.

BRIEF DESCRIPTION OF THE DRAWINGS

Embodiments will now be described with reference to the attached drawings, by way of example only and without intending to be limiting, in which.

DETAILED DESCRIPTION

Figure 4:
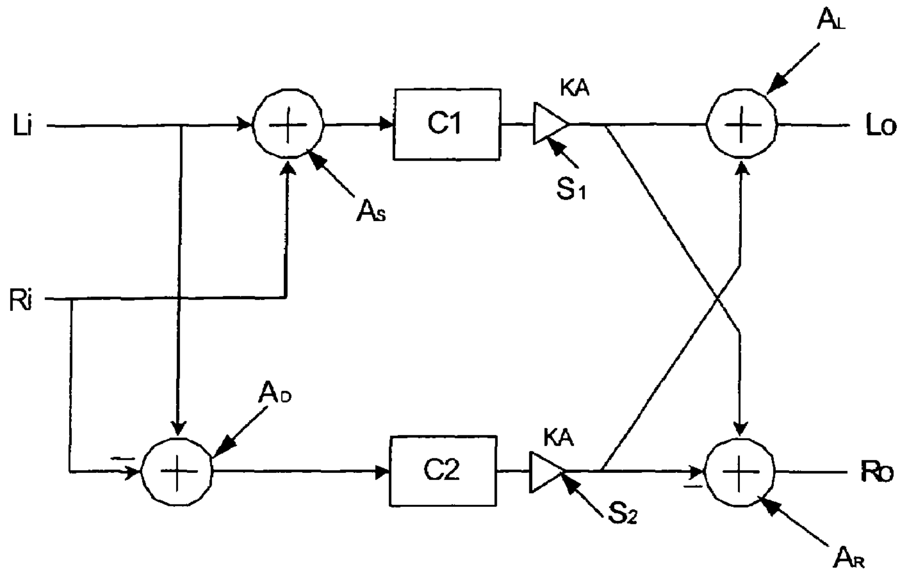
FIG. 4 is a schematic of a circuit arrangement according to an embodiment.

FIG. 4 shows an equaliser arrangement according to an embodiment. The equaliser has two inputs for receiving a left channel signal Li and a right channel signal Ri. The two input signal paths Li and Ri are coupled to an adder $A_S$ which sums the input signals to provide a sum signal (Li+Ri). These are then applied to a first or sum filter C1, and then to a scaling unit S1 which has a gain value of KA. When KA=0.5 it halves the amplitude of the signal output from the first filter C1. The two input paths Li and Ri are also coupled to a subtractor $A_D$ which provides a difference signal (Li−Ri) to a second filter C2. The output of the second filter C2 is coupled to a second scaling unit S2 also having a gain of KA, say 0.5. A second adder $A_L$ adds the processed difference signal from S2 (KA.C2.(Li−Ri)) to the processed sum signal from S1 (KA.C1.(Li+Ri)) to provide a left channel output signal Lo. A second subtractor $A_R$ subtracts the processed difference signal from S2 from the processed sum signal from S1 to provide a right channel output signal Ro.

Thus this "differential" equaliser EQ architecture processes the sum (L+R) and difference (L−R) signals separately.

If the filters C1 and C2 are identical (equal to $C_E$ say as described in relation to FIG. 3) and KA=0.5, when the outputs are recombined the overall result is the same as processing each channel separately through transfer function $C_E$, as is shown below:

$$Lo = C1(Li+Ri)/2 + C2(Li-Ri)/2 = C_E(Li+Ri)/2 + C_E(Li-Ri)/2 = C_E.Li$$

$$Ro = C1(Li+Ri)/2 - C2(Li-Ri)/2 = C_E(Li+Ri)/2 - C_E(Li-Ri)/2 = C_E.\mathrm{Ri}$$

Figure 1:
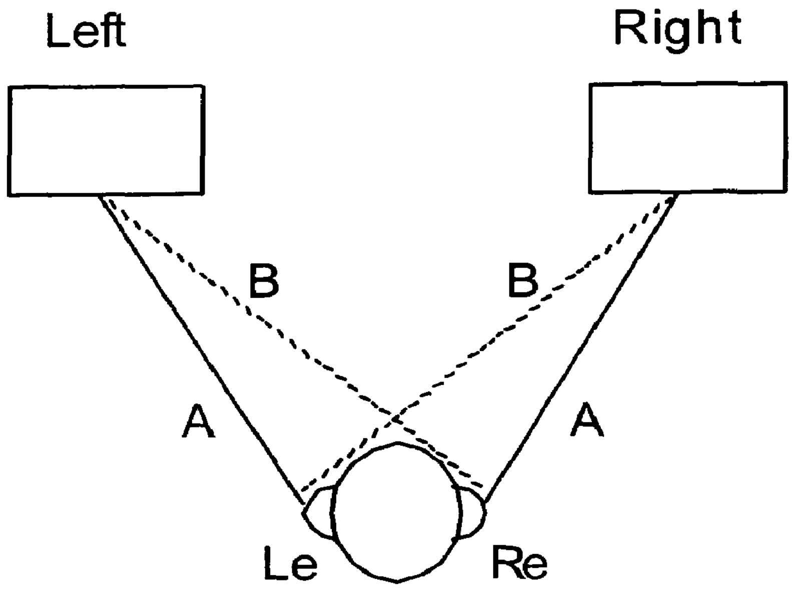
Fig 1 (PRIOR ART)
FIG. 1 illustrates acoustic crosstalk.
Figure 2A:
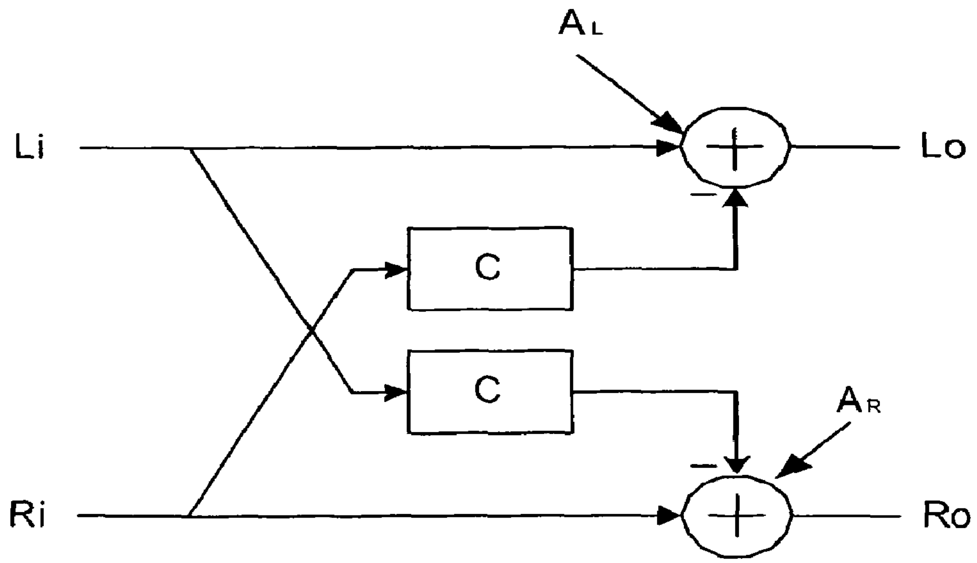
Fig 2a (PRIOR ART)
FIG. 2*a* illustrates a circuit for cancelling acoustic crosstalk.

This is equivalent to processing the signals through the circuit of FIG. 2. If KA is decreased to less than 0.5, both outputs scale accordingly, by a factor of KA/0.5, down to zero as KA approaches zero.

If the filter characteristic C1 is equal to $C_E$, and C2 is equal to the product of $C_E$ and (1+2.K.C'), when the outputs are recombined the overall result is the same as processing each channel separately through the circuit of FIG. 3, as is shown below:

$$\begin{aligned}
Lo &= C1(Li+Ri)/2 + C2(Li-Ri)/2 \\
&= C_E(Li+Ri)/2 + C_E\cdot(1+2K\cdot C')(Li-Ri)/2 \\
&= C_E\cdot(Li + K\cdot C'\cdot(Li-Ri)) \\
Ro &= C1(Li+Ri)/2 - C2(Li-Ri)/2 \\
&= C_E(Li+Ri)/2 - C_E\cdot(1+2K\cdot C'(Li-Ri)/2 \\
&= C_E\cdot(Ri - K\cdot C'\cdot(Li-Ri))
\end{aligned}$$

Again, since both main signal paths are scaled by KA, as KA is decreased to less than 0.5, both outputs scale accordingly, by a factor of KA/0.5, down to zero as KA approaches zero.

Figure 2B:
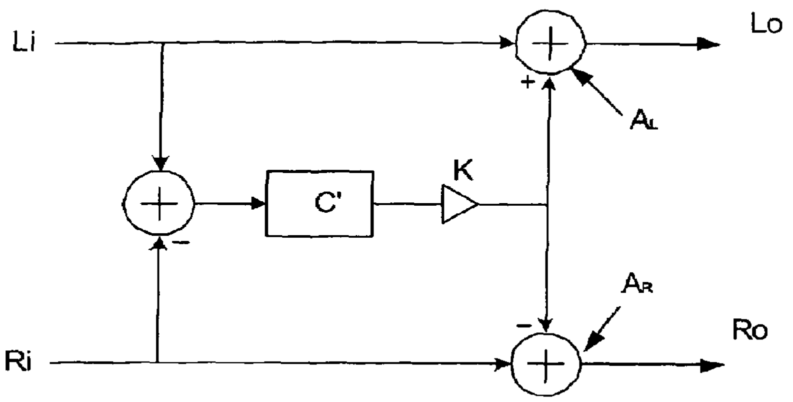
Fig 2b (PRIOR ART)
FIG. 2*b* illustrates another circuit for cancelling acoustic crosstalk.
Figure 5:
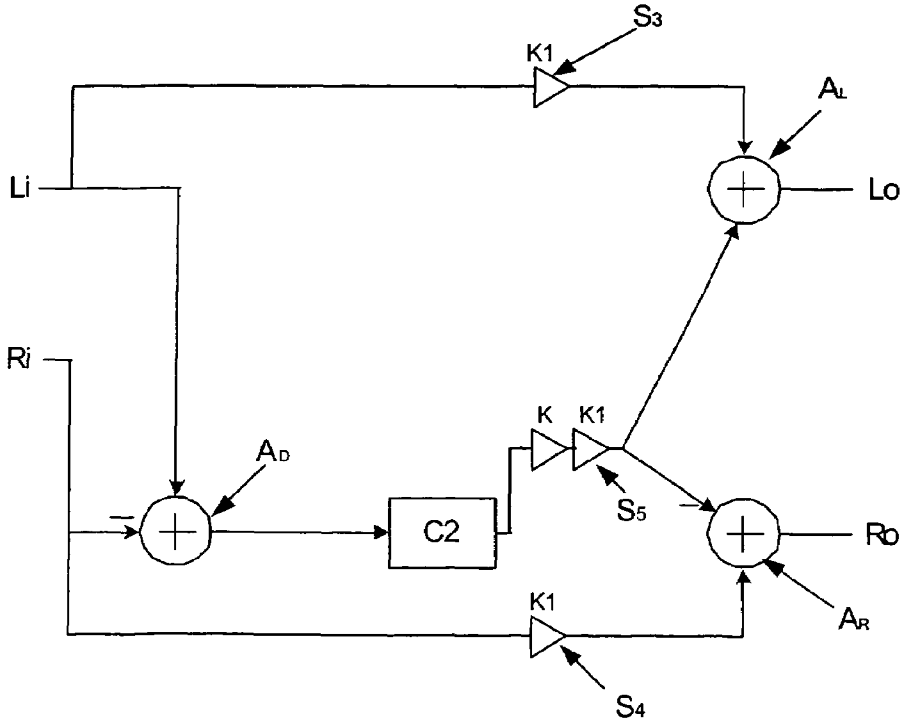
FIG. 5 is a schematic of a circuit arrangement according to another embodiment.

FIG. 5 shows the circuit of FIG. 2*b* modified to incorporate additional scaling elements S3, S4 which scale all outputs by a factor K1 and S5, which scales by the product of K1 and K. If the filter C2 has the same transfer function C' as the filter in FIG. 2*b*, then the outputs Lo and Ro are the same as those from the circuit of FIG. 2*b*, except scaled by K1. Thus when K1=1 they are unscaled, and attenuated to zero when K1=0. Except for this additional scaling, this circuit is functionally equivalent to FIG. 2*b*, and provides a variable amount of "3D" spatial enhancement controlled by K.

Figure 6:
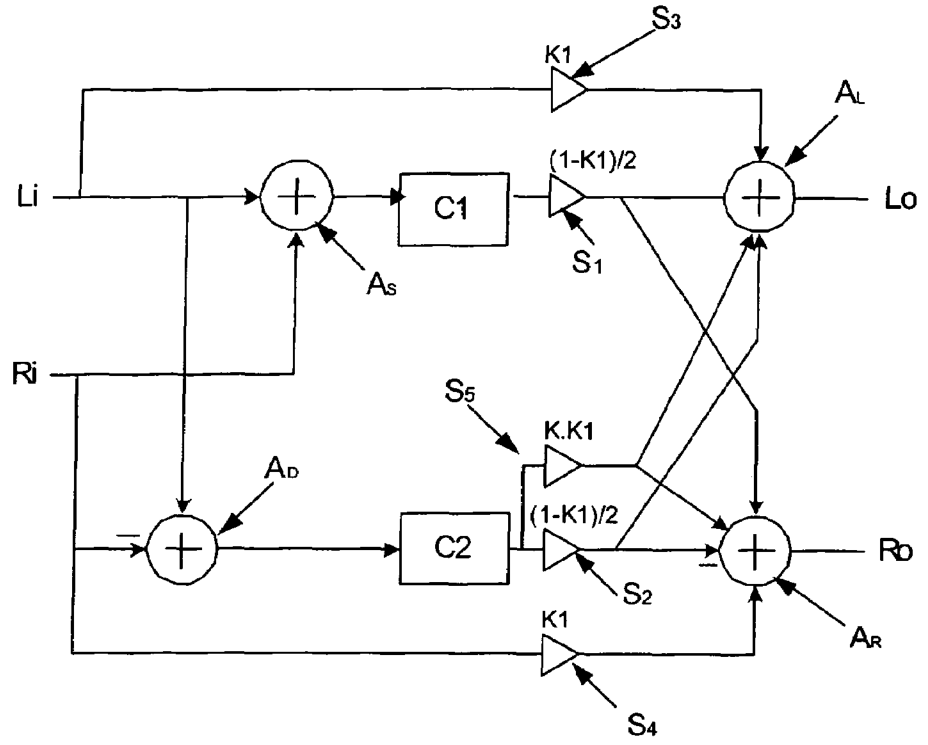
FIG. 6 is a schematic of a circuit arrangement according to another embodiment.

FIG. 6 shows a combined acoustic crosstalk canceller and equaliser circuit architecture according to a preferred embodiment. This can be seen to be a superposition of FIGS. 4 and 5, with the same components having the same references. The scaling factors KA of scalers S1 and S2 are now set to be (1−K1)/2.

The combined crosstalk canceller and equaliser of FIG. 6 is similar to FIG. 4 and has two inputs, for receiving a left channel signal Li and a right channel signal Ri. The two input signal paths Li and Ri are coupled to an adder $A_S$ which sums the input signals to provide a sum signal (Li+Ri). These are then applied to a first or sum filter C1, and then to a scaling unit S1 which has a gain value of (1−K1)/2, where 0<=K1<=1. The two input paths Li and Ri are also coupled to a subtractor $A_D$ which provides a difference signal (Li−Ri) to a second filter C2. The output of the second filter C2 is coupled to a second scaling unit S2 also having a gain of (1−K1)/2.

A second adder $A_L$ adds the processed difference signal from S2 (((1−K1)/2).C2.(Li−Ri)) to the processed sum signal from S1 (((1−K1)/2).C1.(Li+Ri)). A further signal path from the input signal Li to the second adder $A_L$ incorporates another scaling unit S3 having a gain of K1. The scaled input signal K1.Li is added to the processed sum and difference signals by the second adder $A_L$ to provide a left channel output signal Lo. A second subtractor $A_R$ subtracts the processed difference signal from S2 from the processed sum signal from S1. A further signal path from the input signal Ri to the second subtractor $A_R$ incorporates another scaling unit S4 having a gain of K1. The scaled input signal K1.Ri is added to the processed sum and difference signals by the second subtractor $A_R$ to provide a right channel output signal Ro.

A further scaling unit S5 is coupled between the output from the second filter C2 to both the second adder $A_L$ and the second subtractor $A_R$, which in both cases add this scaled output to their other inputs to produce their respective left and right output signals Lo and Ro. The fifth scaling unit has a gain of K.K1, where K is a gain value equivalent to that of the scaling unit in FIG. 3. K is the "3D-gain" value required for a particular effect level from the circuit of FIG. 3.

Thus, these combined functions (spatial enhancement and equalisation) can be performed using just two filter blocks C1 and C2, rather than the three of a typical cascade of these functional blocks. This reduces hardware cost and complexity. It also advantageously reduces power consumption by reducing the number of filter computations required to be performed by the ALU. This is highly desirable in portable devices such as MP3 players where battery life is an important issue.

As discussed above, additional signal paths are present in the circuit of FIG. 6 compared with that of FIG. 4 from the inputs to the output summers, each having a further scaling unit or gain block S3 for the Li to Lo path and S4 for the Ri to Ro path.

Figure 3:
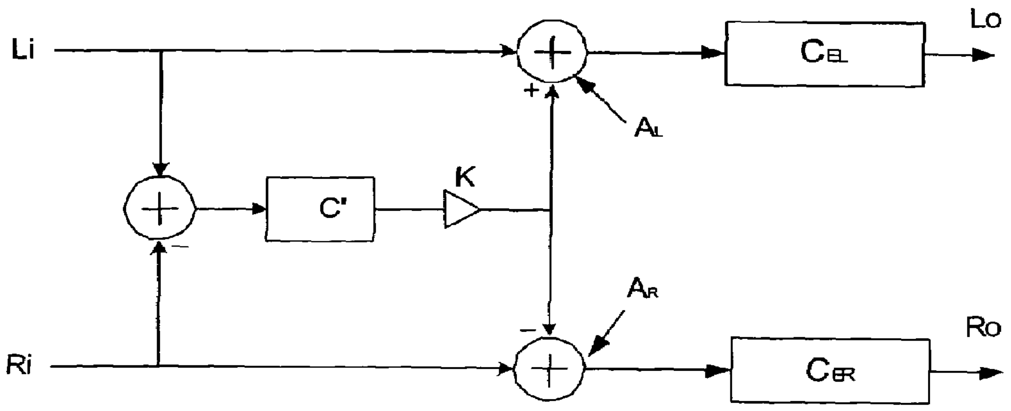
FIG. 3 illustrates another circuit for cancelling acoustic crosstalk, as well as providing a graphic equalisation function.

This architecture combines the variable aspect of the "3D" crosstalk cancelling effect of FIG. 3 or 5 with the equalisation function of FIG. 4 (or the dashed part of FIG. 3). By adjusting K1, the extent of the spatial enhancement and equalisation effects can be adjusted. For example when K1=0, there is no spatial enhancement (3D), but full equalisation (EQ), and when K1=1 there is no EQ but full 3D. Intermediate values of K1 provide a mix of 3D and EQ. The 3D effect can be independently adjusted by varying K; though preferably this is fixed.

In practice C1 can equal C2, enabling sharing of coefficients, and hence saving coefficient memory access and capacity.

As K1 is adjusted, the filter transfers functions C1 and C2 can be adjusted to create the proper 3D or EQ effects as described above with respect to FIGS. 4 and 5. Thus for example when K1=0, the circuit is equivalent to that of FIG. 4, and C1=C =$C_E$ can be used. For K1=1, the circuit is equivalent to FIG. 3, and C2=C' can be used. In the later case the transfer function of filter C1 doesn't matter. For intermediate K1, intermediate filter functions are set. The filter controls will typically be controlled by user input, however it is also possible to preset these depending on the user determined value of K1.

In practice a listener will generally prefer to avoid these extremes and choose some intermediate value of K1, giving a hybrid between the two effects. For values of K1 close to zero, the architecture behaves as an equaliser with some additional enhancement to the spatial properties of the sound due a degree of crosstalk cancellation. For values of K1 close to 1, the spatial effect is very pronounced, but the frequency response equalisation is more subtle.

Whilst not shown in the drawings, the skilled person will appreciate how to interface control signals for varying K1 and the filter functions C1 and C2 with a user interface in order to let a user control these effects. Also, whilst the embodiments have been described where C1=C2, it is equally possible that different equalisation functions could be applied to the left and right channels.

Figure 7:
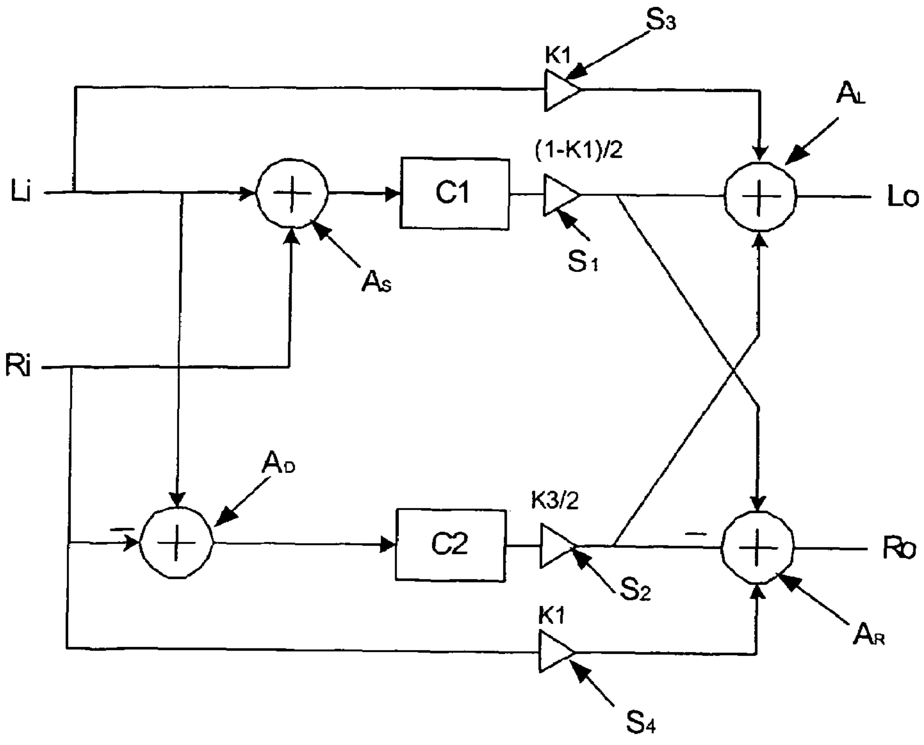
FIG. 7 is a schematic of a circuit arrangement according to another embodiment.

FIG. 7 shows a simplified version of the circuit of FIG. 6 in which two of the scaling units in FIG. 6 (K.K1 and S2) are replaced with a single gain block S2' having a value of K3/2, where K3=1−K1+2K.K1.

The transfer functions for the left and right paths (where C=C1=C2) are equivalent to those of FIG. 6 and are as follows:

$$Lo=C(1-K1)(Li+Ri)/2+C.K3(Li-Ri)/2+K1.Li$$

$$Ro=C(1-K1)(Li+Ri)/2-C.K3(Li-Ri)/2+K1.Ri$$

Equivalently, $$Lo=(C(1-K1)+K1)Li+C.K.K1(Li-Ri)$$

$$Ro=(C(1-K1)+K1)Ri-C.K.K1(Li-Ri)$$

When K1=0 (zero 3D effect), the overall transfer function reduces to that of the circuit of FIG. 4—i.e. this is the same as separately filtering L and R signals with equaliser function C, to give Lo=C.Li and Ro=C.Ri.

When K1=1, $$Lo=Li+C.K(Li-Ri)$$

$$Ro=Ri-C.K(Li-Ri)$$

so the architecture implements the stereo enhancement function of FIG. 3, with the 3D-gain set by K, and the added difference signal filtered by C.

The embodiments provide a number of advantages, for example they allow a more efficient implementation to be used (2 filters are used instead of 3), whilst allowing the user control over both Frequency Response Equalisation and Spatial Enhancement (or acoustic crosstalk cancellation). Additionally, the signal headroom requirements are easier to manage, avoiding the need for wider digital words and the extra hardware costs and power required to process them. This is because the problem of cascading two high gain stages (separate spatial enhancement and equalisation stages) together is avoided.

Whilst the embodiments have been described with respect to digital signal processing, it is equally possible to implement them in other technologies, for example as analogue circuits using op amps with similar advantages in terms of reduced circuit complexity, cost, and power and avoidance of overload or noise peaking under possible filter response selections.

The circuits of the embodiments may be implemented as integrated circuits or chips, and these may be incorporated into various items of audio equipment such as portable MP3 players, computer sound cards, games machines, audio visual equipment such as TV's, stand alone amplifiers or speakers, as well as other digitally based hi-fi sound equipment, digital still and video cameras.

The skilled person will recognise that the above-described apparatus and methods may be embodied as processor control code, for example on a carrier medium such as a disk, CD- or DVD-ROM, programmed memory such as read only memory (Firmware). For many applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

The skilled person will also appreciate that the various embodiments and specific features described with respect to them could be freely combined with the other embodiments or their specifically described features in general accordance with the above teaching. The skilled person will also recognise that various alterations and modifications can be made to specific examples described without departing from the scope of the appended claims.

The invention claimed is:

1. A processing circuit for audio signals and comprising:

inputs for receiving first and second signals respectively;

a first filter arranged to process the sum of said signals;

a second filter arranged to process the difference of said signals;

a first scaling unit coupled to the first input signal to provide a first scaled signal;

a second scaling unit coupled to the second input signal to provide a second scaled signal;

a third scaling unit coupled to the output of the first filter to provide a third scaled signal;

a fourth scaling unit coupled to the output of the second filter to provide a fourth scaled signal;

an adder arranged to add the first scaled signal, the third scaled signal and the fourth scaled signal in order to provide a processed first output signal; and a subtractor arranged to subtract the fourth scaled signal from the sum of the third scaled signal and the second scaled signal in order to provide a processed second output signal.

2. The circuit according to claim 1 further comprising a fifth scaling unit coupled between the second filter and the adding and subtracting.

3. The circuit according to claim 2, wherein the gain values for the scaling units are each dependent on a common variable gain value (K1), and wherein the first and second scaling units have a gain value of K1, the third and fourth scaling units have a gain of (1-K1)/2, and the fifth scaling unit has a gain of K.K1, where K is a gain value for setting the level of acoustic cross talk cancellation.

4. The circuit according to claim 1 further comprising a variable gain circuit arranged to vary the gain values for the scaling units according to user input in order to provide acoustic crosstalk cancellation and/or channel equalisation effects for audio signals.

5. The circuit according to claim 1, wherein the gain values for the scaling units are each dependent on a common variable gain value (K1).

6. The circuit according to claim 1, and wherein the gain values for the scaling units are each dependent on a common variable gain value (K1) and wherein the first and second scaling units have a gain value of K1, the third scaling unit has a gain of (1-K1)/2, and the fourth scaling unit has a gain of (1-K1+2.K.K1)/2, where K is a gain value for setting the level of acoustic cross talk cancellation.

7. The circuit according to claim 1 further comprising a variable equalisation effect circuit arranged to vary a transfer function of the first and/or second filters in order to vary the equalisation effect for the audio signals.

8. The circuit according to claim 7 wherein the variation equalisation effect circuit comprises an input for receiving a user equaliser signal, and is arranged to adjust the transfer function of the first and/or second filters dependent on said signal.

9. An integrated circuit comprising the circuit according to claim 1.

10. Audio equipment comprising an arithmetic logic unit and the circuit according to claim 1.

11. A method of processing audio signals in order to provide acoustic crosstalk cancellation and/or channel equalisation effects, the method comprising:

receiving first and second signals corresponding to a left channel and a right channel of a stereo digital audio signal;

filtering the sum of said signals;

filtering the difference of said signals;

scaling the filtered sum of the input signals;

scaling the filtered difference of the input signals;

scaling the first signal input;

scaling the second signal input;

adding the scaled and filtered difference signal, the scaled and filtered sum signal and the scaled first input signal in order to provide a processed first output signal; and subtracting the scaled and filtered difference signal from the sum of the scaled and filtered sum signal and the scaled second input signal in order to provide a processed second output signal.

12. The method according to claim 11 further comprising scaling said filtered difference of the input signals and adding said scaled filtered difference signal to the processed first output signal and to the processed second output signal.

13. The method according to claim 11 further comprising varying the amount of said scaling according to a user input in order to provide acoustic crosstalk cancellation and/or channel equalisation effects for said audio signals.

14. The method according to claim 11 further comprising varying a transfer function associated with said sum and difference filtering in order to vary the equalisation effect for the audio signals.

15. A computer readable medium encoded with processor code which when implemented on a processor is arranged to carry out the method according to claim 11.

* * * * *